United States Patent
Omstead et al.

(10) Patent No.: US 9,435,038 B2
(45) Date of Patent: Sep. 6, 2016

(54) ION IMPLANT ASSISTED METAL ETCHING

(71) Applicant: Varian Semiconductor Equipment Associates, Inc., Gloucester, MA (US)

(72) Inventors: Thomas Omstead, Gloucester, MA (US); William Davis Lee, Newburyport, MA (US); Tristan Ma, Lexington, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/473,424

(22) Filed: Aug. 29, 2014

(65) Prior Publication Data
US 2016/0060767 A1    Mar. 3, 2016

(51) Int. Cl.
*B44C 1/22*     (2006.01)
*C23F 17/00*   (2006.01)
*C23F 1/08*    (2006.01)
*C23F 1/00*    (2006.01)
*H01J 37/317*  (2006.01)

(52) U.S. Cl.
CPC .............. *C23F 17/00* (2013.01); *C23F 1/00* (2013.01); *C23F 1/08* (2013.01); *H01J 37/3171* (2013.01)

(58) Field of Classification Search
CPC ............ C23F 17/00; C23F 1/00; C23F 1/08; H01L 37/3171
USPC ................... 216/62, 37; 438/705; 252/79.1
See application file for complete search history.

(56) References Cited

U.S. PATENT DOCUMENTS

| | | | | |
|---|---|---|---|---|
| 6,335,062 B1* | 1/2002 | Sartwell | ................. | C23C 14/48 427/527 |
| 6,432,798 B1* | 8/2002 | Liu | ................... | H01L 21/76237 257/E21.551 |
| 7,214,327 B2 | 5/2007 | Chen et al. | | |
| 8,008,207 B2* | 8/2011 | Yu | ........................ | G03F 7/2043 438/705 |
| 8,329,583 B2* | 12/2012 | Dussarrat | ................ | C23C 16/18 257/E21.477 |
| 2012/0187087 A1* | 7/2012 | Ohshiro | ................... | C23F 1/18 216/95 |

OTHER PUBLICATIONS

Tristan MA, et al., Techniques and Apparatus for Anisotropic Metal Etching, U.S. Appl. No. 14/452,127, filed Aug. 5, 2014.
Thomas R. Omstead, et al., Techniques and Apparatus for Anisotropic Metal Etching, U.S. Appl. No. 14/452,153, filed Aug. 5, 2014.

* cited by examiner

*Primary Examiner* — Duy Deo
*Assistant Examiner* — Maki Angadi
(74) *Attorney, Agent, or Firm* — Nields, Lemack & Frame, LLC (57) ABSTRACT

An improved method of etching a metal substrate is described. After a mask layer is applied to the metal substrate, an ion implantation process is performed which implants ions, such as oxygen ions, into the exposed regions of the metal substrate. This implantation creates regions of metal oxide, which may be more susceptible to etching. Afterwards, the exposed regions of metal oxide are subjected to an etching process. This process may be through vaporization or may be a wet etch process. In some embodiments, the etchant is selected so that the metal oxide binds with the etchant to form a volatile compound, which stays in the vapor or gaseous state. This may reduce the unwanted deposition of the metal to other surfaces. These ion implantation and etching processes may be repeated a plurality of times to create a recessed feature of the desired depth.

17 Claims, 6 Drawing Sheets

ION IMPLANT ASSISTED METAL ETCHING

FIELD

Embodiments of this disclosure are directed to apparatus and methods of etching metal substrates, and in particular, copper films.

BACKGROUND

In various applications, it may be beneficial to etch a metal substrate, such as copper. In some embodiments, sputtering or plasma etching may be used to remove a layer of metal from a particular region of a substrate. For example, it may be advantageous to create a trench, hole or channel in a metal substrate. To do so, a mask layer may be applied to portions of the metal substrate, leaving exposed the region to be removed. Next, a plasma etching or sputtering operation may be performed which removes metal from the exposed region. While this process does remove the metal, there may be several disadvantages. First, the etch process may not create a trench, hole or channel that has vertical sidewalls. In other words, the sidewalls may taper inward in the trench. Secondly, an etch process may produce species that are unstable or have limited volatility, which may later deposit on other surfaces, such as the mask layer. Finally, the rate of metal etching may be slow, impacting manufacturing yield and cost.

Therefore, it would be beneficial if there were an improved method for etching metal substrates that created more vertical sidewalls without producing unwanted metal particles. In addition, it would be advantageous if there were an apparatus that implemented this method.

SUMMARY

An improved method of etching a metal substrate is described. After a mask layer is applied to the metal substrate, an ion implantation process is performed which implants ions, such as oxygen ions, into the exposed regions of the metal substrate. This implantation creates regions of metal oxide, which may be more susceptible to etching. Afterwards, the exposed regions of metal oxide are subjected to an etching process. This process may be through vaporization or may be a wet etch process. In some embodiments, the etchant is selected so that the metal oxide binds with the etchant to form a volatile compound, which stays in the vapor or gaseous state. This may reduce the unwanted deposition of the metal to other surfaces. These ion implantation and etching processes may be repeated a plurality of times to create a recessed feature of the desired depth.

In one embodiment, a method of forming a recessed feature in a metal substrate is disclosed. The method comprises implanting oxygen ions into a region of the metal substrate to form a metal oxide region; and exposing the metal oxide region to an etchant. In a further embodiment, the etchant chemically reacts with metal oxide in the metal oxide region to form a volatile metal precursor. In a further embodiment, the etchant does not chemically react with the metal substrate. In one embodiment, the etchant comprises HFAc. In another embodiment, the etchant comprises acetic acid.

In a second embodiment, a method of forming a recessed feature in a metal substrate is disclosed. The method comprises performing a sputtering or etch process to create the recessed feature; implanting oxygen ions into metal depositions created by the sputtering or etch process; and exposing the metal depositions to an etchant after the implanting. In a further embodiment, the sputtering process comprises directing hydrogen ions toward the metal substrate. In some embodiments, the etchant comprises HFAc. In other embodiments, the etchant comprises acetic acid.

In a third embodiment, a processing apparatus for creating a recessed feature in a metal substrate is disclosed. The processing apparatus comprises a first chamber, comprising an ion source; a second chamber comprising an etchant delivery system; and a movable platen, capable of being translated between the first chamber and the second chamber.

BRIEF DESCRIPTION OF THE FIGURES

For a better understanding of the present disclosure, reference is made to the accompanying drawings, which are incorporated herein by reference and in which.

DETAILED DESCRIPTION

An improved method of creating a channel, hole or trench in a metal substrate is disclosed. Although the disclosure refers to trenches, hole and channels, it is recognized that the disclosed methods may be used to create any three-dimensional recessed feature in the metal substrate. Further, copper is used as an exemplary embodiment, however, the methods described herein are also applicable to other metal substrates, such as transition metals, including but not limited to cobalt, iron, nickel and others.

Figure 1A:
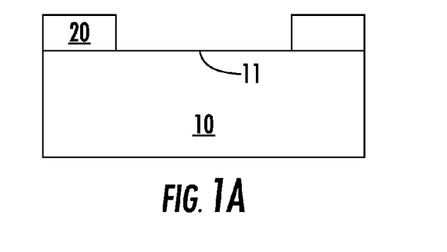
FIGS. 1A-1E shows a first sequence that may be performed to create a recessed feature in a metal substrate.

FIGS. 1A-1E shows a first sequence that may be performed to create a recessed feature, such as a trench, hole or channel in a metal substrate. First, as shown in FIG. 1A, a mask layer 20 is applied to the metal substrate 10. The mask layer 20 may be any suitable material. In one embodiment, silicon nitride (SiN) is used as the mask layer 20. In another embodiment, tantalum is used as the mask layer 20. However, any material that is resistant to the etchant and sputtering from the implant may be used. The mask layer 20 is applied to the metal substrate 10 and creates exposed regions 11 of the metal substrate 10. These exposed regions 11 will be etched in a subsequent process to create a three-dimensional recessed feature, such as a trench, hole or channel, in the metal substrate 10.

Figure 1B:
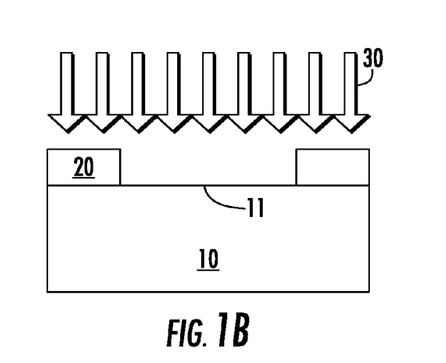

An ion implantation process is then performed, as shown in FIG. 1B. This ion implantation process is performed to create regions of metal oxide in the exposed regions 11 of the metal substrate 10. Oxygen ions 30 are directed toward the metal substrate 10. The mask layer 20 inhibits or substantially limits the passage of oxygen ions to the metal substrate 10 disposed beneath the mask layer 20. However, the oxygen ions are implanted into the exposed regions 11 of the metal substrate 10. The ion implantation process may be performed at a plurality of energy levels so as to create a near uniform distribution of oxygen ions throughout a particular depth of the exposed region 11. For example, different implant energies may be used to create a near uniform oxygen distribution in the first 10 nanometers of the exposed region. Of course, the dose may also be adjusted as the energy level is adjusted. The oxygen ions may be $O^+$, $O_2^+$, $O_3^+$ or any other oxygen ion. The ion implantation may be performed using a beam-line ion implanter, a plasma chamber or any other ion implanter. In the case of a plasma chamber, the bias voltage applied to the platen on which the metal substrate 10 is disposed may be adjusted to create the desired oxygen distribution. For example, more negative bias voltages may serve to drive the oxygen ions deeper into the metal substrate 10.

In some embodiments, the ion implantation process is limited to lower energies so as to minimize straggle. This may be beneficial in creating more vertical sidewalls when the recessed feature is formed.

Figure 1C:
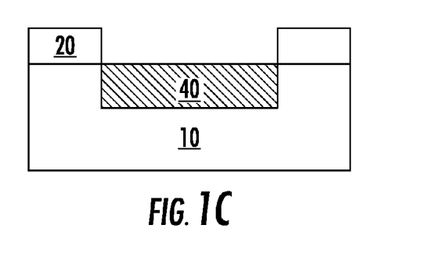

This ion implantation process serves to create a metal oxide region 40 in the exposed region, as shown in FIG. 1C. The metal oxide, which, in one particular embodiment, may be copper oxide, extends to the depth to which the oxygen ions were implanted. In some embodiments, the metal oxide may extend to a depth of about 10 nanometers, although other depths are also possible.

After this, an etching process is performed. In the embodiment shown in FIG. 1D, etchant 50 is directed toward the metal substrate 10. Again, the mask layer 20 is resistant to the etchant and resists etching. However, the metal oxide region 40 is susceptible to the etchant 50. The metal oxide in the metal oxide region 40 chemically reacts with the etchant 50, creating a metal precursor.

Figure 1D:
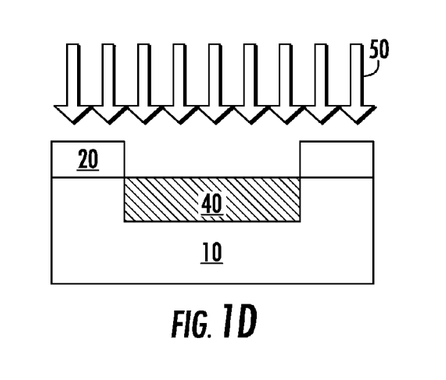

A metal precursor is a metal with molecules or atoms attached to allow it to be at least somewhat present in a gaseous form. A volatile metal precursor may be defined as a metal precursor that has a vapor pressure that is useful at a given temperature and is stable at that temperature. This allows the metal precursor to be used to transport metals either to the substrate or away from it.

As stated above, this metal precursor may be in gaseous or vapor form and may disassociate from the metal oxide region 40.

In some embodiments, the chamber in which the etching process is performed is maintained at very low pressure, such as less than 100 millitorr. This low pressure assists in removing the metal precursor from the metal oxide regions 40.

In one particular embodiment, the metal substrate 10 may be copper and the etchant 50 may be hexafluoroacetylacetonate, or HFAc ($CF_3C(O)CH_2C(O)CF_3$). The formal name of this etchant is 1,1,1,5,5,5-hexafluoro-2,4-pentanedione.

When HFAc is reacted with copper oxide, it yields Copper(II) hexafluoroacetylacetonate ($Cu(II)(HFAc)_2$) according to the following reaction:

$$Cu_2O + 2H^+Hfac \rightarrow Cu(HFAc)_2 + H_2O$$

This compound is a volatile metal precursor and may readily form into a gas or vapor, which can quickly be exhausted from the chamber. However, HFAc is not reactive with copper, and thus a vertical sidewall may be defined in the recessed feature.

In another embodiment, acetic acid is vaporized and the etchant 50 comprises acetic acid vapor. Acetic acid reacts with copper oxide to form copper acetate, which can be removed from the metal oxide region 40.

Other etchants may also be used. For example, cyclopentadiene ($C_5H_6$), arsine ($AsH_3$), trimethylarsine ($(CH_3)_3As$), phosphine ($PH_3$), trimethylphosphine ($(CH_3)_3P$, triethylphosphine and 1.5-cyclooctadiene may also be used. In general, each of these etchants functions by forming a chelating compound in which bidentate ligands form a coordinate bond with copper oxide. If a suitable etchant is selected, the resulting copper compound may be volatile. The more volatile the copper compound, the higher the etch rate that may be achieved.

As described above, in some embodiments, the metal is copper. Copper may exist as copper (I) or copper (II). Most copper (II) compounds may have two rings made of some variant of HFAc or Ac. Copper (I) compounds may have one ring of HFAc or Ac or Cyclopentadiene with a Lewis Base such as trimethylvinylsilane, trimethylphosphine, and various alkynes.

In addition, each of these etchants may optionally have a ligand, such as cyclopentane ($C_5H_{10}$). This list is not exhaustive. Other etchants are also possible. However, these etchants are selected due to their ability to bond with a metal oxide to form a volatile metal precursor, which can be readily exhausted from the chamber.

In some embodiments, these etchants may be in gaseous form and can be readily introduced into the chamber. In other embodiments, these etchants may be in liquid form, which are vaporized before they can be employed in FIG. 1D. There are a number of ways in which a liquid etchant, such as acetic acid, may be vaporized. In one embodiment, a vapor draw is used to vaporize the etchant. In another embodiment, the liquid etchant can be directly injected into the chamber in which the etching takes place. Since the pressure within the chamber is very low, such as less than 100 millitorr, the liquid etchant immediately vaporizes once it enters the chamber. In a third embodiment, vaporized etchant may be created by bubbling a gas, such as nitrogen, through the liquid etchant. Of course, other methods of vaporizing an etchant may be used and the present disclosure does not exclude any such method.

Regardless of the method used to create the vaporized etchant, the etchant 50 is then introduced into the chamber and exposed to the metal oxide region 40.

In another embodiment, a wet etch process is performed. In this embodiment, etchant 50 is in liquid form and is contacted with the metal oxide region 40 so as to remove the metal oxide material. After the wet etch process, the metal substrate 10 may be dried.

Thus, either a dry etch or a wet etch process may be performed and the disclosure is not limited to a particular etching process.

Figure 1E:
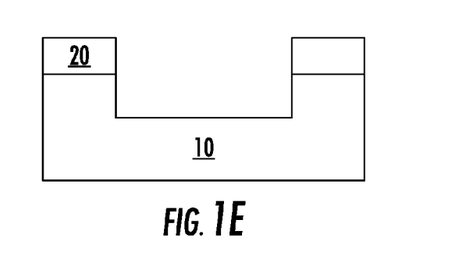

FIG. 1E shows the metal substrate 10, where the metal oxide region 40 has been etched away by the etchant 50.

The sequence shown in FIGS. 1A-1E may remove a prescribed depth of exposed metal from the metal substrate 10. For example, in some embodiments, about 10 nm are removed each time the sequence shown in FIGS. 1B-1E is performed. To remove a greater amount of metal, so as to form a deeper recessed feature, the sequence shown in FIGS. 1B-1E may be repeated a plurality of times until the desired depth is reached.

Figure 2:
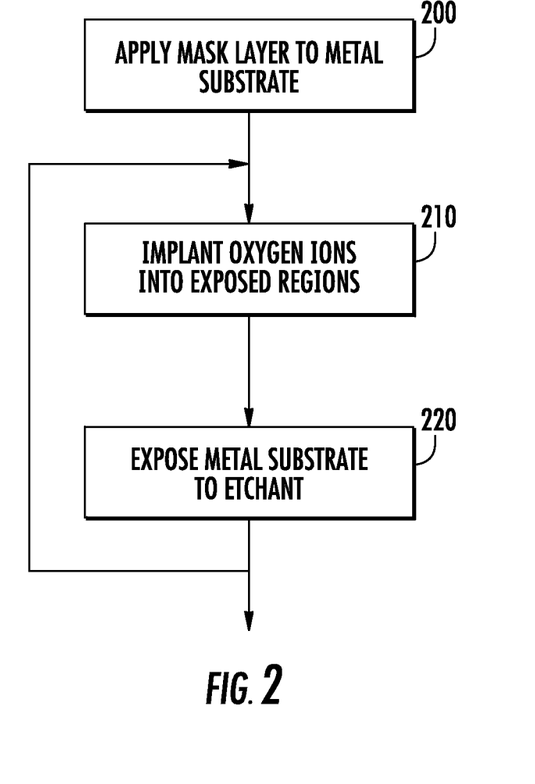
FIG. 2 shows a flowchart describing the sequence of FIGS. 1A-1E.

FIG. 2 shows the processes involved in creating recessed features in a metal substrate. First, as shown in process 200, a mask layer is applied to a metal substrate. As described above, the mask may be SiN, tantalum, or any material that is resistant to the etchant. The metal substrate may be copper, iron, cobalt, nickel or other metals.

Next, as shown in process 210, oxygen ions are implanted into the exposed regions of the metal substrate. These implanted ions create one or more metal oxide regions in the metal substrate. As described above, the ion implantation may be performed at a plurality of energy levels to create a nearly uniform distribution of oxygen in the metal substrate and to reduce straggle.

The metal substrate is then exposed to an etchant, as shown in process 220. This etchant may be in gas or vapor form (for a dry etch) or may be in liquid form (for a wet etch). The etchant is selected so that it chemically reacts with the metal oxide but does not or minimally reacts with the metal. This etchant serves to remove the metal oxide regions.

The etchant reacts with the metal oxide to form a volatile metal precursor. This metal precursor can be readily exhausted from the chamber. In this way, the deposition of metal particles on the mask layer or other surfaces is minimized.

If the recessed feature is not yet of the desired depth, processes 210 and 220 may be repeated a plurality of times until the desired depth is achieved. This method may be preferred as ion straggle in the metal may be reduced by using a greater number of lower energy implants.

Figure 3A:
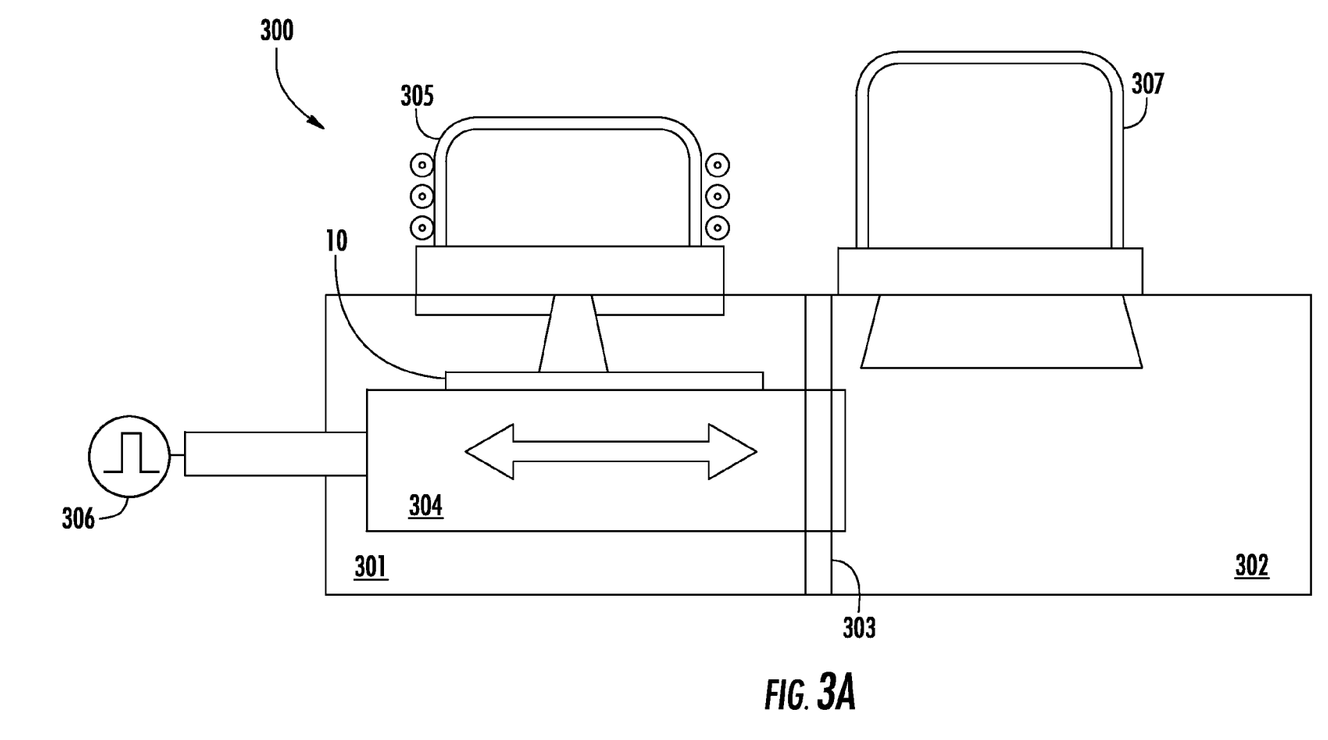
FIGS. 3A-3B show different tools that may be used to perform the sequence of FIG. 2.

FIG. 3A shows a first embodiment of a tool that may be used to perform the method illustrated in FIG. 2. The tool 300 may have two chambers; a first chamber 301, and a second chamber 302. The first chamber 301 and the second chamber 302 may be separated by a baffle 303, such as a differentially pumped baffle. A platen 304, such as an electrostatic chuck, is disposed in the first chamber 301 and the second chamber 302 and may be translated between the two chambers, such as by a motor (not shown). An ion source 305 is in communication with the first chamber 301. This ion source 305 may be an inductively coupled plasma (ICP) source, although other types of ion sources may also be employed.

The platen 304 may be in communication with a power supply 306 which may apply bias voltage pulses to the platen 304.

A vaporizer 307 may be in communication with the second chamber 302.

In operation, the metal substrate 10 is disposed on the platen 304. The platen 304 is disposed in the first chamber 301. The ion source 305 is then actuated so as to create oxygen ions. These oxygen ions are attracted to the platen 304 by the application of a negative bias pulse to the platen 304 as provided by power supply 306. A plurality of bias pulses may be applied to the platen 304 to achieve the desired distribution and concentration of oxygen ions in the metal substrate 10. In some embodiments, the amplitude of the bias pulses may vary to drive the ions to different depths within the metal substrate 10.

The platen 304 is then translated from the first chamber 301 to the second chamber 302. A baffle may be disposed between the first chamber 301 and the second chamber 302 to prevent intermixing of gasses between chambers.

The vaporizer 307 is used to convert the etchant, which may be in liquid form, into a gas or vapor, which is then released into the second chamber 302. The vaporized etchant deposited into the second chamber 302 chemically reacts with the metal oxide in the metal substrate 10. The etchant and the metal oxide chemically react to form a volatile precursor that can be readily exhausted from the second chamber 302.

The platen 304 may then be translated back to the first chamber 301, where more oxygen ions may be implanted into the metal substrate 10, and the process can be repeated an arbitrary number of times.

Figure 3B:
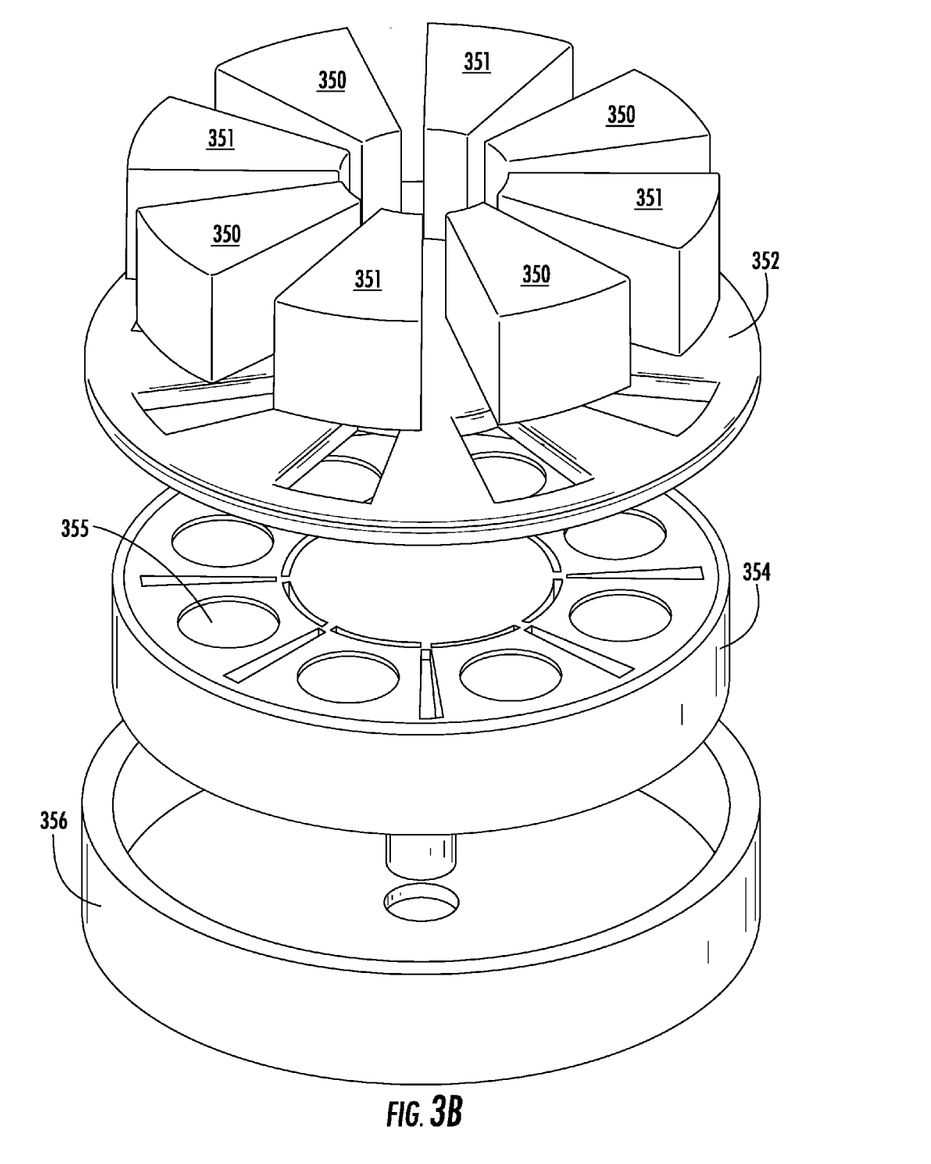

FIG. 3B shows a second embodiment of a tool that may be used to perform the method illustrated in FIG. 2. In this embodiment, a set of first chambers 350 may include coils in order to create a plasma where oxygen ions are created. Other ion sources may also be used. The set of first chambers 350 is used to introduce oxygen ions. A set of second chambers 351 may or may not include coils, as the set of second chambers 351 is used to deliver the etchant. The first chambers 350 and second chambers 351 are disposed on a top plate 352. While FIG. 3B shows four first chambers 350 and four second chambers 351, the disclosure is not limited to this or any particular number of chambers.

The top plate 352 is disposed above a rotary table 354. The rotary table 354 has a plurality of workpiece indentations 355, each adapted to hold one workpiece. The rotary table 354 may also comprise a plurality of pumping slots (not shown) to exhaust gasses. The rotary table 354 may be rotatably attached to a base 356.

In operation, a workpiece may be disposed in each workpiece indentation 355. Each workpiece is either contained within a first chamber 350 or a second chamber 351. If the workpiece is contained within a first chamber 350, oxygen ions are implanted into it, as the first chambers 350 includes coils or another ion source. If the workpiece is contained within a second chamber 351, it is exposed to an etchant, as the second chamber 351 includes an etchant delivery system.

After the workpiece has been processed in its respective chamber, the gasses in the respective chambers may be exhausted through the pumping slots. After the gasses are exhausted, the rotary table 354 may be rotated relative to the chambers. Thus, a workpiece that was previously contained within a first chamber 350 is now disposed in a second chamber 351. Similarly, a workpiece that was previously contained within a second chamber 351 is now disposed in a first chamber 350. Thus, after the rotary table 354 has been rotated once, each workpiece disposed thereon has been exposed to both processes. If these two processes are to be repeated a plurality of times, the rotary table 354 may be rotated an arbitrary number of times. For example, in the embodiment shown in FIG. 3B, if the rotary table is rotated 360°, each workpiece will be exposed to four ion implantation processes and four etching processes.

While FIGS. 3A and 3B show tools having two or more chambers with a workpiece (or workpieces) that move between these chambers, other tools may be used. For example, in one embodiment, the metal substrate 10 may be moved between two different, separate chambers. In another embodiment, the ion implantation process and the etching process may occur in different tools, and thus, the metal substrate 10 may be moved between two different, separate tools. In another embodiment, both the ion implantation process and the etching process may occur in the same chamber. For example, the chamber may be purged of any gasses or metal precursors created during the first process before the second process is commenced. The chamber is then purged of any gasses or metal precursors after the completion of the second process before the first process is repeated.

FIGS. 4A-4E show another embodiment that may be used for creating a recessed feature in a metal substrate. In this embodiment, a mask layer 420, such as tantalum, is applied to the metal substrate 410. Sputtered ions 430, such as hydrogen ions or any similar ions that rely on physical sputtering and/or limited chemical etching to create a recessed feature, are then directed toward the metal substrate 410. In other words, any sputtering or etch process may be used to create the recessed feature 415, shown in FIG. 4B.

Figure 4A:
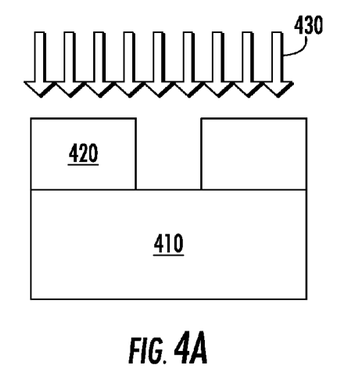
FIGS. 4A-4E shows a second sequence that may be performed to create a trench or channel in a metal substrate.
Figure 4B:
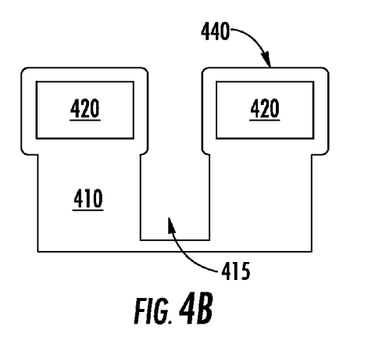

These sputtered ions 430 may cause metal hydrides to be sputtered or etched from the metal substrate 410, thus forming a recessed feature 415. However, these metastable metal hydride molecules are short-lived and only slightly volatile, and therefore may redeposit on other portions of the metal substrate 410 or the mask layer 420. For example, FIG. 4B shows metal deposition 440 on the mask layer 420 and near the upper part of the recessed feature 415. This redeposition of metal in these areas may be undesirable.

Figure 4C:
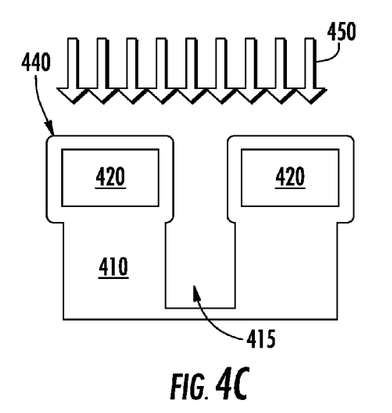

Therefore, in this embodiment, as shown in FIG. 4C, oxygen ions 450 are directed at the metal substrate 410. The oxygen ions 450 penetrate any exposed metal. Therefore, the oxygen ions will create regions of metal oxide in the recessed feature 415, and also will convert the metal deposition 440 into metal oxide.

Figure 4D:
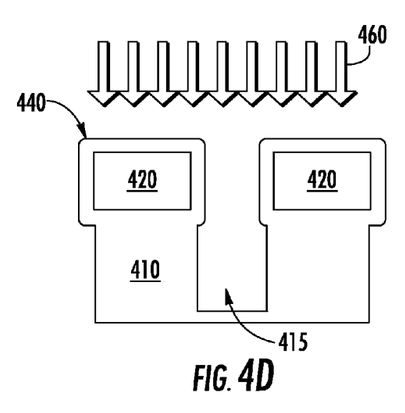
Figure 4E:
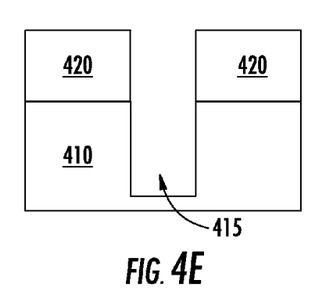

In FIG. 4D, the metal substrate 410 is exposed to an etchant 460. The etchant 460 may be any suitable material, such as those described earlier. The etchant 460 serves to remove the metal oxide from the recessed feature 415 and the mask layer 420, resulting in the metal substrate seen in FIG. 4E.

In some embodiments, it may be useful to repeat the sequence shown in FIGS. 4C-4D a plurality of times to remove all of the metal deposition 440 from the recessed feature 415 and the mask layer 420.

Thus, in this embodiment, the recessed feature 415 is first formed by other etching techniques that may cause metal redeposition and thus a less than desirable etch profile. The redeposition is eliminated in this embodiment through the use of ion implantation and additional etching processes.

Figure 5:
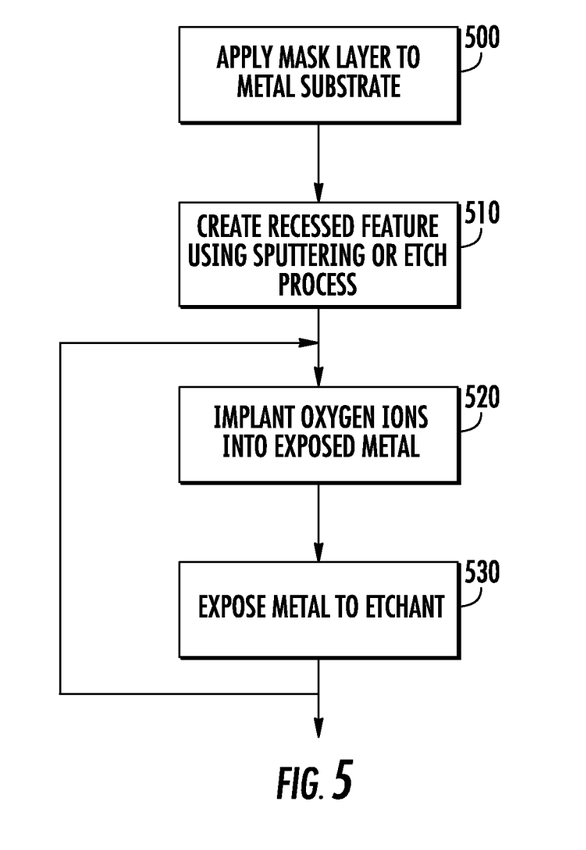
FIG. 5 shows a flowchart describing the sequence of FIGS. 4A-4E.

FIG. 5 shows a flowchart representing the sequence shown in FIGS. 4A-4E. First, a mask layer is applied to the metal substrate, as seen in process 500. After the mask has been applied, a sputtering or etch process is used to create a recessed feature. The sputtering or etch process serves to remove metal from the exposed regions in the form of metal hydrides. These metal hydrides are short-lived and only slightly volatile, and therefore may redeposit on the metal substrate and the mask layer. To remove this metal deposition, oxygen ions are directed toward the metal substrate, as shown in process 520. These oxygen ions create metal oxide wherever the oxygen implants into the metal deposition. The metal substrate is then exposed to an etchant, as shown in process 530, which serves to remove the metal deposition. The processes 520-530 may be repeated a plurality of times to remove the entirety of the metal deposition.

Thus, the inclusion of an ion implantation process to create a metal oxide in a metal substrate may be used to create recessed features in the metal substrate with more vertical sidewalls than are otherwise possible. Furthermore, the use of the ion implantation process, in combination with certain etchants, may result in the creation of volatile metal precursors, which are far less likely to redeposit on the metal substrate during the etching process. These volatile metal precursors may be readily exhausted from the chamber. This may improve the quality and yield of the resulting metal substrate, and result in less contamination.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of forming a recessed feature in a metal substrate, comprising:
    implanting oxygen ions into a region of said metal substrate to form a metal oxide region having a thickness of about 10 nm;
    exposing said metal oxide region to an etchant;
    and repeating said implanting and exposing to create said recessed feature of a desired depth,
    wherein the oxygen ions are implanted at a plurality of energies so as to create a uniform distribution of oxygen ions throughout the metal oxide region.

2. The method of claim 1, wherein said etchant chemically reacts with metal oxide in said metal oxide region to form a volatile metal precursor.

3. The method of claim 2, wherein said etchant does not chemically react with said metal substrate.

4. The method of claim 3, wherein said etchant is in liquid form.

5. The method of claim 3, wherein said etchant comprises acetic acid.

6. The method of claim 2, wherein said etchant is introduced into a chamber and said method further comprises exhausting said volatile metal precursor from said chamber.

7. The method of claim 6, wherein the chamber is maintained at a pressure of less than 100 millitorr during the exposing.

8. The method of claim 1, wherein said etchant is in vapor or gas form.

9. The method of claim 1, wherein said etchant comprises HFAc.

10. The method of claim 1, further comprising applying a mask layer to said metal substrate prior to said implanting.

11. The method of claim 1, wherein said metal substrate comprises a transition metal.

12. A method of forming a recessed feature in a metal substrate, comprising:
    performing a sputtering or etch process by directing hydrogen ions toward said substrate to create said recessed feature, wherein the sputtering or etch process creates metal depositions;
    implanting oxygen ions into the metal depositions created by said sputtering or etch process; and
    exposing said metal depositions to an etchant after said implanting.

13. The method of claim 12, wherein said etchant chemically reacts with metal oxide in said metal depositions to form a volatile metal precursor.

14. The method of claim 13, wherein said etchant comprises acetic acid.

15. The method of claim 12, wherein said etchant is in vapor or gas form.

16. The method of claim 12, wherein said etchant is in liquid form.

17. The method of claim 12, wherein said etchant comprises HFAc.

* * * * *